United States Patent [19]

Donovan et al.

[11] Patent Number: 4,633,920
[45] Date of Patent: Jan. 6, 1987

[54] POSITIONING DEVICE

[75] Inventors: James G. Donovan, Wilmington, Mass.; Charles O. Wittemen, Pelham, N.H.

[73] Assignee: Avco Corporation, Wilmington, Mass.

[21] Appl. No.: 631,703

[22] Filed: Jul. 17, 1984

[51] Int. Cl.$^4$ .............................................. B21F 1/00
[52] U.S. Cl. ................................. 140/105; 74/89.14
[58] Field of Search ................ 140/105, 106, 147; 72/482, 478; 227/84, 93; 53/388; 29/564.1, 566.3, 838, 835, 874; 74/89.14, 89.15, 424.8 R

[56] References Cited

U.S. PATENT DOCUMENTS

| | | | |
|---|---|---|---|
| 3,483,765 | 12/1969 | Fornataro | 74/89.14 |
| 3,548,479 | 12/1970 | Netta et al. | 140/147 |
| 3,844,177 | 10/1974 | Bourassa | 74/89.15 |

Primary Examiner—Lowell A. Larson
Attorney, Agent, or Firm—Abraham Ogman

[57] ABSTRACT

The invention is an improvement in the feed mechanism for a lead-forming machine for axial-leaded electronic components. The invention comprises a combination of a reverse threaded shaft, controlled by a hand-manipulable knob, which shaft in turn may precisely and rapidly mechanically control one or more walls of the feed chute of the forming machine, the function of which is to orient a small object, such as an electronic component, so that the object assumes a predetermined position with respect to a forming element which then imparts a bend, twist or other change in the shape of said object. The invention is particularly useful for rapid set-up to impart predetermined bends in electrically conductive leads used in capacitors, transistors and similar components for electronic equipment.

2 Claims, 5 Drawing Figures

Fig. 4.
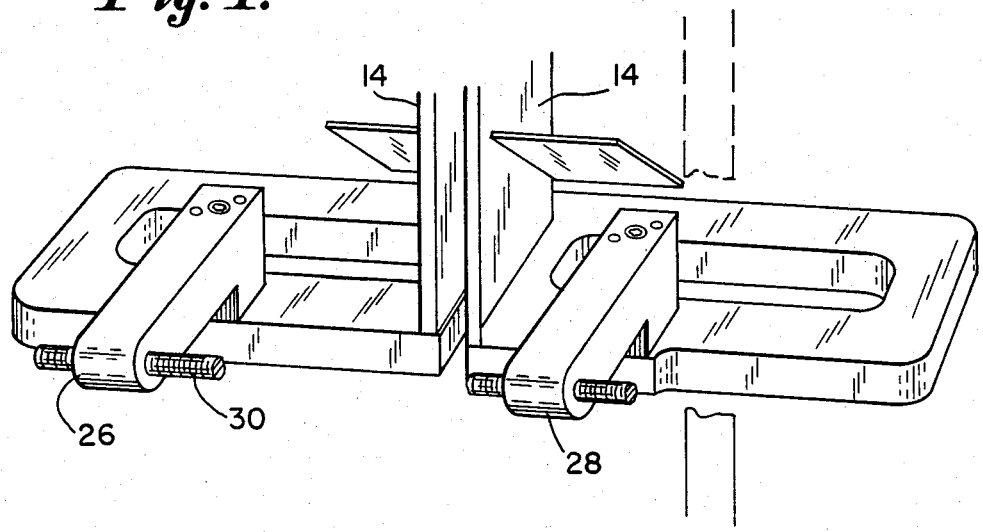
Fig. 2A.
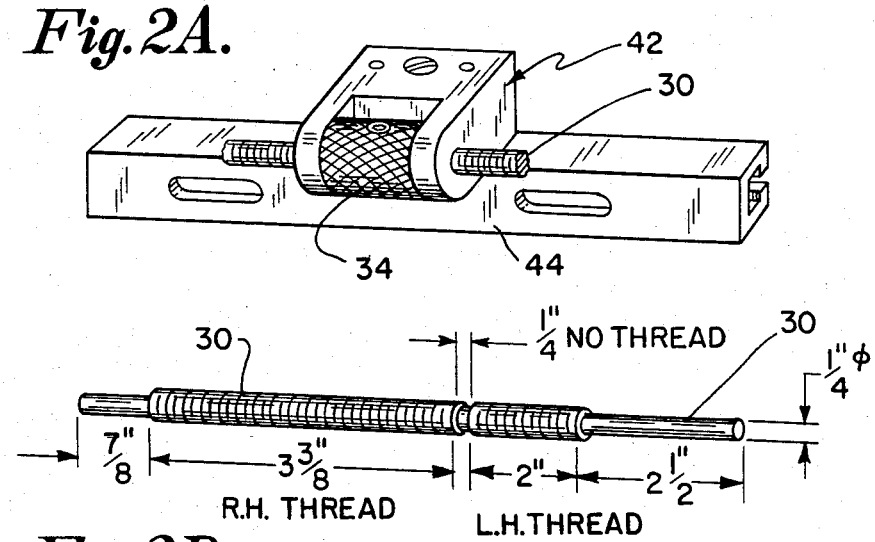
Fig. 2B.

POSITIONING DEVICE

BACKGROUND OF THE INVENTION

This invention relates to the field of electronics and in particular to the assembly of electronic components to printed wiring boards. The invention is particularly designed to be incorporated within electronic component lead-forming machinery: a typical such device is the Mark V Component Lead Former, mnufactured by Technical Devices Co., Culver City, Calif.

In the manufacture of small to moderate-sized electronic equipment such as electronic tuners, amplifiers and receivers, it is common to use a series of elements, such as electronic capacitors, whose general configuration takes the form of a generally cylindrical main body portion having rigid but bendable metallic leads aligned on the axis of the cylinder and projecting outboard from each end along such axis. Such elements are commonly referred to as axial leaded components. These leads must commonly be bent in a precise, predetermined fashion by a forming tool so they may readily be positioned and connected in the desired location in the printed wiring board.

Several manufacturers of machine tools make and sell such component-forming tools; a typical example of such a tool is the aforesaid Mark V Component Lead Former. While forming tools of this general character perform acceptably when the various chutes, baffles and component-holding elements are properly positioned, a common disadvantage is the extended set-up time needed for manual positioning of each of the walls of the orienting feed chute. This is generally accomplished by trial and error with the use of wrenches, pliers and other common hand tools. While such lengthy set-up time, frequently a matter of hours, can be justified for an extended production run of thousands of electronic components, such set-up time becomes excessive for job-shop forming operations involving runs of as few as 10 to 20 components of a given desired configuration. In addition to lengthy set up time, the trial-and-error set up technique results in inaccurate, non-repeatable results and often leads to a scrap rate of as much as 60 percent (based on a lot size of five components).

Accordingly, one object of the present invention is to provide a mechanism for precise positioning of feed mechanisms with respect to the forming elements of the component-forming devices.

A further object is to provide a mechanism for reducing set-up time for component-forming devices from several hours to less than a minute or two, with additional improvement in the precision of positioning the walls and other parts of the feed system.

A still further object is to provide means for adjusting the walls of a feed chute assembly of such devices, while the assembly is in an operating position, thus permitting ready testing of the accuracy of such positioning.

Other objects of the invention will in part be apparent from the description herein and will in part appear hereinafter.

The invention accordingly comprises the product possessing the features, properties and the relation of components and the process involving the several steps and the relation and order of one or more of such steps with respect to each of the others which are exemplified in the following detailed disclosure, and the scope of the application of which will be indicated in the claims.

SUMMARY OF THE INVENTION

The invention disclosed herein comprises apparatus for quickly and precisely positioning the feed mechanism in a component lead-forming device employing a reverse-threaded shaft which drives the two retaining walls of said feed mechanism toward or away from each other, said shaft cooperating with a fixed positioning knob which may drive the entire feed mechanism leftward or rightward along the axis of the shaft. By manual rotation of the associated control knobs, it is possible to position axial-leaded electronic components of varying lengths and configurations quickly and precisely for further forming.

For a fuller understanding of the nature and objects of the invention, one should refer to the following detailed description taken in connection with the accompanying drawings in which:

BRIEF DESCRIPTION OF THE DRAWING

FIG. 2a is a perspective view of the control feed chute adjustment knob assembly, hereinafter described in detail; FIG. 2b is a cutaway view of FIG. 2a, showing a preferred threading configuration of the threaded shaft with suggested dimensions, described later, FIG. 4 is a perspective view of a preferred configuration for operatively linking the threaded shaft and control knobs assembly to the feed chute assembly.

DETAILED DESCRIPTION OF EMBODIMENTS

Figure 1:
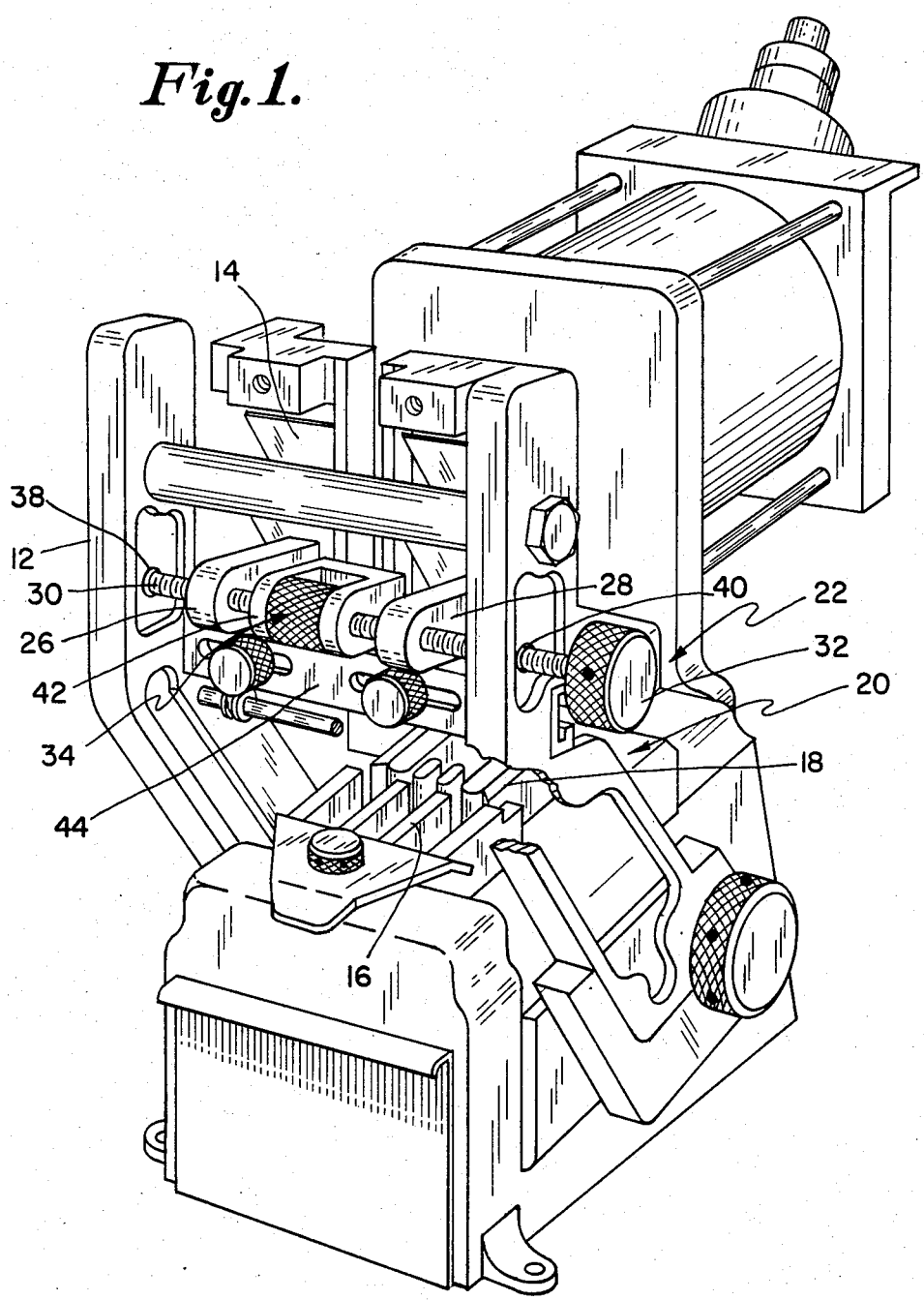
FIG. 1 is a simplified perspective view of a typical component-forming machine incorporating the invention, showing a detailed perspective view of a portion of the machine displaying the elements constituting the invention.

FIG. 1 of the drawings shows in simplified form a component lead-forming machine of the type similar to the aforementioned Component Lead Former, Mark V, comprising a main support frame 12 supporting a baffle assembly 14, a component-supporting die nest 16, a forming tool 18 attached to a drive mechanism 20, and a feed-chute positioning mechanism which consists of a threaded shaft 30, brackets 26 and 28, center bracket 42, midpoint adjustment knob 34, center support column 44, end adjustment knob 32, and other parts conventionally embodied in such machines. As shown in FIG. 1, this machine allows the above-described electronic components to be gravity-fed to forming tool 18 (located in die nest 16), while being tumbled in guided fashion by means of the vertically-aligned side plates of the baffle assembly 14 to assure proper alignment for contact with forming tool 18.

As shown in FIG. 4, two sets of side plates of baffle assembly 14 are suitably and conventionally supported by, respectively, shaft support brackets 26 and 28.

As shown in FIGS. 1 and 4, the outboard free end of each of brackets 26 and 28 is suitably tapped to accept and be driven by a single reverse-threaded shaft 30 which passes through the tapped portions of both brackets. The threading of shaft 30 may be configured with left-hand threading along approximately half its operative length and right-hand threading along the remaining portion so that when shaft 30 is rotated in a first direction, brackets 26 and 28 will be driven toward each other, along an axis parallel to the axis of shaft 30; when the direction of rotation is reversed, brackets 26 and 28 will correspondingly be driven away from one another.

Obviously, threading direction and other elements may be reversed or otherwise varied, so long as rotation of the shaft 30 about its axis in a single direction of rotation will cause brackets 26 and 28 to move toward one another and rotation in the opposite direction will cause said brackets to move apart. In this manner, the aperture in the baffle assembly 14 may be rapidly and precisely adjusted to accept and properly position components of a given size and shape in the forming tool 18.

Shaft 30 may be driven manually by one or more adjustment knobs; in one preferred embodiment, two preferably knurled adjustment knobs may be used. One knob, end adjustment knob 32, is preferably located at the right-hand side of shaft 30, viewed from the usual operator's station (since most operators are right-handed) and is rigidly attached to shaft 30; midpoint adjustment knob 34 is preferably located at the approximate midpoint of shaft 30, and is held in fixed location at the horizontal midpoint of forming machine 10 by center bracket 42, which is in turn rigidly attached to center support column 44. It will be obvious that the diameter, number and precise location of adjustment knobs is a matter of convenience, so long as the knob configuration will permit generation of sufficient torque to drive shaft 30 and the elements of baffle assembly 14 easily without undue operator exertion. Locks, rachets and other devices known to the art may be used to hold shaft 30 in the desired position, particularly if the invention is used in an environment of high vibration, but shaft 30 will generally retain its position by friction alone. While brass is a preferred material for shaft 30, brackets 26 and 28 and any adjustment knob, any suitably stiff, durable and workable metal or plastic material may be used. Shaft 30 may preferably extend through the thickness of main support frame 12, passing through unthreaded apertures 38 and 40 of any suitable configuration.

Figure 3:
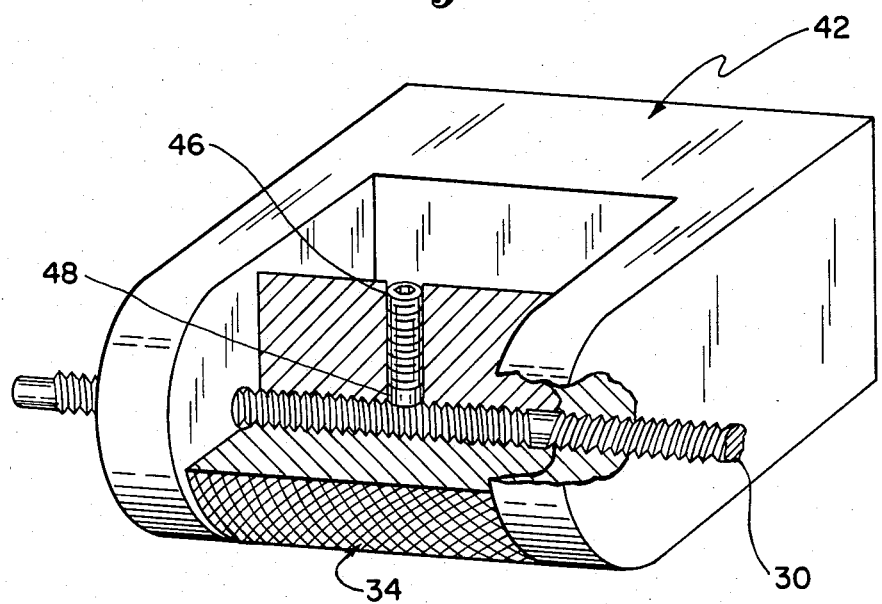
FIG. 3 is a perspective cutaway of the central portion of FIG. 2a, showing a preferred engagement mechanism for the central feed chute adjustment knob assembly.

A preferred threading configuration for threaded shaft 30 is shown generally in FIG. 2a and in schematic form in FIG. 2b. Referring to FIG. 2b, it is critical to note that the threading of shaft 30 is unidirectional along the length of shaft 30 which is engaged by midpoint adjustment knob 34; the direction is reversed outboard of the knob, as shown. The mechanism of such engagement is shown in FIG. 3, which is a cutaway view of knob 34. Centrally located in knob 34 is a setscrew 46 extending radially through a tapped channel in knob 34, pressing at its inner end against a freely rotatable cylindrically-shaped plastic plug 48 which may engage a groove in shaft 30 when set screw 46 is suitably rotated. Plug 48 may preferably be made of Teflon, nylon or another suitably rigid material that will not cause excessive wear of the grooves of shaft 30. While plug 48 may be eliminated, so that the inner tip of set screw 46 directly engages shaft 30, the use of the freely rotatable plug 48 significantly reduces wear with insignificant loss in the precision of the linkage between midpoint adjustment knob 34 and shaft 30.

The linkages among shaft 30, knobs 32 and 34 and the baffle assembly 14 permit rapid and precise positioning of the side plates of baffle assembly 14, thereby precisely positioning the component whose leads are to be shaped by forming tool 18. When, for example, the operator rotates end adjustment knob 32, thereby rotating shaft 30 in the same direction, bracket 26, and the baffle sideplate rigidly attached to it, will move in a given direction along the axis of shaft 30 while, at the same time, bracket 28, and its rigidly affixed baffle sideplate, will move in the opposite direction along such axis, thus increasing or decreasing the aperture between the sideplates to accommodate a component of a given length. During such rotation, the midpoint adjustment knob 34 will rotate freely in synchronism with shaft 30 because of the frictional linkage established by proper positioning of set screw 46. If, however, midpoint adjustment knob 34 is manually rotated while end adjustment knob 32 is held fixed and not allowed to rotate, knob 34, since it is laterally restrained at the center of forming device 10 by center bracket 42, will drive shaft 30 leftward or rightward (depending on the direction in which knob 34 is rotated) along its axis, thereby positioning both side plates of baffle assembly 14 leftward or rightward in tandem, without changing the aperture between them. This will, in turn, impart a leftward or rightward repositioning of the component to be shaped.

In addition, the mechanism herein disclosed or its equivalent will yield at least the following benefits:

1. Reduction in set-up time, resulting in increased operating time, since the lengthy trial and error technique has been eliminated. Set-up is now achieved rapidly through the use of adjustment knobs.

2. Ease of set-up, by eliminating the need for numerous hand tools. Additionally, numerous cumbersome steps, such as attempting to maintain the approximate positioning of the baffle assembly while torqueing the retaining bolts, have been eliminated.

3. Accuracy and repeatability of set-up, by improving on the previous highly inaccurate method of approximately positioning the baffle assembly; if a somewhat accurate setting was by chance achieved, the repeatability of such a setting would be sheer luck and coincidence. Under the system taught herein, the positioning of the baffle assembly is both accurate and repeatable.

4. Reduction in scrap rate, by eliminating the prior trial-and-error set-up, which required that approximately three components be used (and destroyed) to achieve a merely acceptable positioning of the baffle assembly. Based on a lot size of five components, these three wasted components equated to a 60 percent scrap rate. With the modifications completed, the scrap rate is near zero.

In its original state, a forming machine such as the aforementioned Mark V, is ideally suited for use in a high volume, stockroom type area. With the modifications, the Mark V can be marketed to both a low volume, assembly area environment as well as the high volume, stockroom type area. Thus, once modified, the market potential of such machines is greatly increased and it becomes possible to service an entirely new market.

In summary, the mechanisms here described permit both setting a predetermined baffle aperture and a predetermined left-right position within a few seconds without any disassembly of the lead-forming device or the need for any hand tools.

While a preferred embodiment of the invention is described herein, several variant configurations are possible within the scope of the invention. It is obvious, for example, that if shaft 30 is capable of being optionally pinned to location bracket 36 by any convenient means, both variation of the baffle aperture and leftward-rightward positioning of the baffle assembly 24 may be controlled by midpoint adjustment knob 34 alone. Other modifications of the positioning mechanism will be obvious to those skilled in the art. It will further be obvious that the mechanism herein disclosed is not limited to component lead-forming devices, but may be advantageously used in any device in which it is desirable to establish both the aperture between elements and the positioning of those elements along an axis. Since certain changes may be made without departing from the scope of the invention involved, it is intended that all matter contained in the above description or shown in the accompanying drawings shall be interpreted as illustrative and not in a limiting sense.

What is claimed is:

1. In an electronic component lead-forming device and similar apparatus, feed mechanism positioning apparatus comprising in combination:

a threaded shaft supported in a main frame operatively connected to a pair of positioning means for positioning said components with respect to a forming tool, said shaft having a first threading in a given direction of spiral along a predetermined portion of its driving length and having a second threading with an oppositely-directed spiral along the remainder of its driving length, one of said pair of positioning means being located so as to be driven by the right-hand-threaded portion of said shaft and the other of said pair being located so as to be driven by the left-hand-threaded portion of said draft, driving means for manually rotating said shaft about its axis, and second driving means having a threaded passage conforming to and an engagement with one of said threading of said shaft, said second driving means being constrained against axial movement whereby when rotated while said shaft is held against rotation, said second driving means will move said shaft axially.

2. Feed mechanism positioning apparatus in accordance with claim 1 in which the position of said second driving means is fixed with respect to the main frame of said lead-forming device.

* * * * *